United States Patent [19]
Cederberg et al.

[11] Patent Number: 5,391,875
[45] Date of Patent: Feb. 21, 1995

[54] INFRARED SENSOR PACKAGE

[75] Inventors: Andrew A. Cederberg, North Grafton; Willard C. Litchfield, Scituate, both of Mass.

[73] Assignee: Raytheon Company, Lexington, Mass.

[21] Appl. No.: 555,867

[22] Filed: Jul. 18, 1990

[51] Int. Cl.6 .............................. G01J 5/04; G01J 5/08
[52] U.S. Cl. ..................................................... 250/352
[58] Field of Search .............................. 250/352, 338.1

[56] References Cited

U.S. PATENT DOCUMENTS

| | | | |
|---|---|---|---|
| 4,059,764 | 11/1977 | Belasco et al. | 250/352 |
| 4,833,898 | 5/1989 | Chudy et al. | 62/51.1 |
| 4,918,929 | 4/1990 | Chudy et al. | 62/51.1 |

FOREIGN PATENT DOCUMENTS

| | | | |
|---|---|---|---|
| 58-37514 | 3/1983 | Japan | 250/352 |

OTHER PUBLICATIONS

Karins, J. P. et al., "Dualband Focal Planes for Infrared Systems", *Proc. IRIS Detector*, vol. I, 1989, pp. 273–287.
McCall, K. et al., "Performance Results for MWIR and LWIR Infrared Focal Plane Arrays", *Proc. IRIS Detector*, vol. II, 1989, pp. 209–219.

*Primary Examiner*—Stephen C. Buczinski
*Attorney, Agent, or Firm*—Donald F. Mofford

[57] ABSTRACT

A dual-band infrared sensor package for use in radar system applications is provided. The package includes two detector arrays, an InSb photodiode array sensitive in the mid-wave infrared radiation range and a HgCdTe photodiode array sensitive in the long-wave infrared radiation range. The package further includes integrated circuits which provide electrical control to and data output from the detector arrays. A three dimensional arrangement of the detector arrays, integrated circuits, and ceramic interconnecting substrates is used to provide a relatively small sensor package suitable for radar system applications so that radar signals are not obscured.

28 Claims, 7 Drawing Sheets

INFRARED SENSOR PACKAGE

This invention relates generally to the detection of infrared electromagnetic radiation and more particularly to packaging infrared sensors.

As it is known in the art, infrared electromagnetic radiation refers to the region of the electromagnetic spectrum between wavelengths of approximately 0.7 and 1000 micrometers, which is between the upper limit of the visible radiation region and the lower limit of the microwave region. Infrared radiation is sometimes broken into three sub-regions: near-infrared radiation with wavelengths between 0.7-1.5 micrometers, intermediate-infrared radiation with wavelengths between 1.5-20 micrometers, and far-infrared radiation with wavelengths between 20-1000 micrometers. The intermediate-infrared radiation region is often further broken into the mid-wave region with wavelength limits of 3-5 micrometers and the long-wave region with wavelength limits of 8-10 micrometers.

As it is also known in the art, infrared radiation is produced principally by electromagnetic emissions from solid materials as a result of thermal excitation. The detection of the presence, distribution, and direction of infrared radiation requires techniques which are unique to this spectral region. The wavelengths of infrared radiation are such that optical methods may be used to collect, filter, and direct the infrared radiation. For example, photosensitive devices are often used as infrared sensitive elements. Photosensitive devices convert heat, or infrared electromagnetic radiation, into electrical energy. Such photosensitive devices respond in proportion to the number of infrared photons within a certain range of wavelengths to provide electrical energy.

Generally, an infrared sensor includes a plurality of infrared sensitive elements in order to provide suitable resolution of the field of view, or scene, which is to be monitored. In addition to the plurality of infrared sensitive elements, an infrared sensor includes other components for complete processing of the information provided by incident infrared electromagnetic radiation. Optical filters and apertures are used to define and focus the radiation directed at the infrared sensitive elements. Electronics are necessary for controlling the data collection and processing the collected data from the infrared sensitive elements. Cooling apparatus is necessary to maintain the operation of the infrared sensitive elements as well as the electronics. One approach for processing the electrical energy provided by the plurality of infrared sensitive elements is to use multiplexers to provide a single signal having a serial data stream since it is simpler to process the single resulting serial signal than the plurality of signals which correspond to the plurality of infrared sensitive elements. The serial signal is generally further processed by any number of techniques known in the art to provide interpretable, useful information regarding objects in the field of view of the infrared sensor.

As it is also known in the art, military and space applications employ infrared electromagnetic radiation detection for such functions as tracking and searching. These applications require the detection of low-level radiation in the intermediate infrared radiation range. One application for infrared detection is in radar systems.

Infrared detection is an attractive feature for radar systems because inter alia while radar signals are obscured by atmospheric obstacles such as clouds, certain wavelengths of infrared radiation are detectable through such obstacles. Further, angular resolution capability is greater with infrared detectors than with radar due to the shorter wavelength of the infrared radiation. Often radar will be used for long distance tracking while infrared detection is used for closer range tracking. Also, the inclusion of infrared detection in a radar system, particularly the detection of more than one band, or range, of infrared radiation, makes the system more difficult to jam, or disable.

However, in order for infrared radiation detection to be successfully incorporated into a radar system, the infrared sensor must have a relatively small profile in order to minimize degradation of the radar performance by obscuration of the radar signals. The miniaturization of single band infrared detectors, as well as of dual-band infrared detectors which provide detection of two infrared radiation ranges and require essentially twice the amount of circuitry as single-band detection, provides a challenge in packaging. In papers entitled "Performance Results for MWIR and LWIR Infrared Focal Plane Arrays," by K McCall et al published in Proc. IRIS Detector, 1989, Vol. II, pgs. 209–219, and "Dual-band Focal Planes for Infrared Systems," by J. P. Karins et al. published in Proc. IRIS Detector, 1989, Vol. I, pgs. 273–287, two infrared detector arrays, one sensitive to mid-wave infrared radiation, and one sensitive to long-wave infrared radiation are used simultaneously. However, neither paper describes the incorporation of the two detectors and the associated electronics into a package which is suitably small to be used in radar system applications.

Thus, it would be desirable to have the capability for infrared detection of one band, or more than one band (i.e. dual-band) of infrared radiation, in a suitably small package for use in radar system applications.

SUMMARY OF THE INVENTION

In accordance with the present invention, an infrared sensor includes a support member with a first end having a cavity disposed therein and a second end with a platform having a side non-coplanar with said platform. The cavity disposed in the first end of the support member substantially extends along the length of the member and provides a housing for cooling apparatus. Preferably, disposed over the platform of the second end is a first means, responsive to electromagnetic radiation having wavelengths within a first range of wavelengths, for providing a first plurality of signals corresponding to the intensity of incident electromagnetic radiation having wavelengths within said first range of wavelengths. The infrared sensor further includes multiplexing means, disposed over the side that is non-coplanar with the platform and having a plurality of inputs fed by signals provided by the first infrared responsive means, for providing at least one serial data stream corresponding to the signals provided by the first infrared responsive means. With such an arrangement, an infrared sensor is provided with a relatively small profile, such detector being suitable for use in radar systems in which it is desirable to minimize obscuration of the radar signals. The side non-coplanar with the platform of the support member provides a surface for mounting signal processing components to provide a three-dimensional arrangement of such components and the infrared responsive means.

In accordance with a further aspect of the present invention, the infrared sensor further includes means, responsive to electromagnetic radiation within a first and a second range of wavelengths, for providing a plurality of signals corresponding to intensity of incident electromagnetic radiation having wavelengths within said first and second range of wavelengths. The infrared sensor further includes said support member having a side non-coplanar with said platform and further includes multiplexing means, disposed over said side and having a plurality of inputs fed by signals provided by the infrared responsive means, for providing at least one serial data stream corresponding to the signals provided by the infrared responsive means. With such an arrangement, an infrared sensor is provided with means responsive to infrared electromagnetic radiation having wavelengths within two ranges, or equivalently having dual-band infrared detection capability. Further, due to the mounting surface provided by the side non-coplanar with the platform, the dual-band infrared sensor is provided with a relatively small profile and is thus suitable for use in a radar system.

In accordance with a further aspect of the present invention, the means responsive to infrared radiation in said first and second range of wavelengths includes, first means disposed over the platform of the second end, and responsive to electromagnetic radiation having wavelengths within a first range of wavelengths, for providing a first plurality of signals corresponding to the intensity of incident electromagnetic radiation having wavelengths within said first range of wavelengths. Also disposed over the platform of the second end is second means, responsive to electromagnetic radiation having wavelengths within a second range of wavelengths, for providing a second plurality of signals corresponding to the intensity of incident electromagnetic radiation having wavelengths within said second range of wavelengths. The infrared sensor further includes first through fourth multiplexing means. The first multiplexing means is disposed over the platform and has a plurality of inputs fed by a first portion of the first plurality of signals provided by the first means and provides a serial data stream corresponding to the first portion of the first plurality of signals provided by the first means. The second multiplexing means is also disposed over the platform, and has a plurality of inputs fed by a first portion of the second plurality of signals provided by the second means for providing a serial data stream corresponding to the first portion of the second plurality of signals provided by the second means. The third multiplexing means is disposed over a first one of a pair of sides non-coplanar with the platform and has a plurality of inputs fed by a second, remaining portion of the first plurality of signals provided by the first means for providing a serial data stream corresponding to the second, remaining portion of the first plurality of signals provided by the first means. The fourth multiplexing means is disposed over a second one of the pair of sides non-coplanar with the platform and has a plurality of inputs fed by the second, remaining portion of the second plurality of signals provided by the second means for providing a serial data stream corresponding to the second, remaining portion of the second plurality of signals provided by the second means.

With such an arrangement, an infrared sensor having the capability to detect incident infrared radiation in two infrared wavelength ranges, for example the mid-wave infrared radiation range having wavelengths between approximately 3.0 and 5.0 micrometers, and the long-wave infrared radiation range having wavelengths between approximately 8.0 and 10.0 micrometers, is provided. The multiplexing means provides control for, and data output from, the first and second infrared responsive means. The serial data stream provided by the multiplexing means contains information regarding the intensity and direction of infrared electromagnetic radiation incident on the infrared responsive means. The multiplexing means is disposed over a pair of sides non-coplanar with the platform, in order to reduce the size of the infrared sensor by providing a three dimensional arrangement of infrared responsive means and multiplexing means. The size reduction provided by the mounting of multiplexing means on the pair of sides non-coplanar with the platform provides an infrared sensor package suitable for use in radar systems in which the radar signals should not be obscured. Therefore, with such arrangements, a dual-band infrared sensor is provided which, due to its relatively small size, is suitable for use in radar systems.

BRIEF DESCRIPTION OF THE DRAWINGS

The foregoing features of this invention, as well as the invention itself, may be more fully understood from the following detailed description of the drawings in which.

DESCRIPTION OF THE PREFERRED EMBODIMENTS

Fabrication of an infrared sensor for use in a radiation detection system, particularly adapted for use with a radar system and having a size which minimizes obscuration of radar signals, will now be described in conjunction with FIGS. 1-5.

Figure 1:
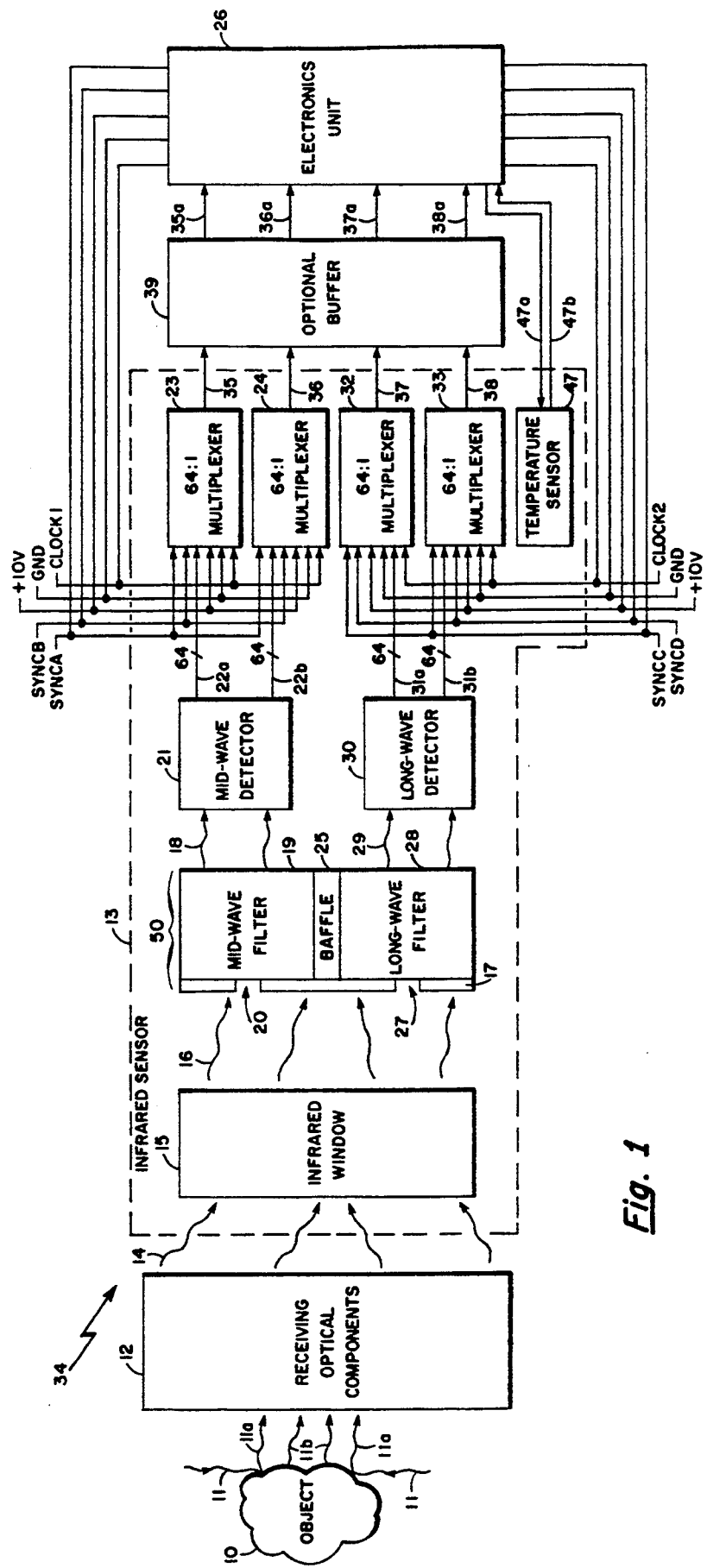
FIG. 1 is a block diagram of a radiation detection system including a dual-band infrared sensor.

Referring now to FIG. 1, a radiation detection system 34 is shown to include an infrared sensor 13. Here, the radiation detection system 34 is a radar system having a radome (not shown) in which the infrared sensor 13 is disposed. The infrared sensor 13 provides information regarding the presence, distribution, and direction of objects in a particular scene or field of view based on the infrared electromagnetic radiation which is emitted and/or reflected by such objects. The radar portion (not shown) of radiation detection system 34 provides similar information regarding the same objects based on the radar, or millimeter wavelength, signals emitted and/or reflected by such objects. It is often advantageous to have infrared and radar detection in a system since generally radar detection provides better long range information, and infrared detection provides better resolution in the detection of objects at closer ranges. Also, certain atmospheric conditions are better suited to infrared detection than to radar detection.

Incident electromagnetic radiation 11 from a source (not shown) reflects off object 10 providing reflected radiation 11a, or object 10 may be a source which emits electromagnetic radiation 11b as a result of thermal excitation. Emitted radiation 11b and reflected radiation 11a have wavelengths characterized by the object 10. A portion 11a, 11b of radiation is directed to the receiving optical components 12 of radiation detection system 34. The receiving optical components 12 will vary depending on the radiation detection system 34. As previously mentioned, here the infrared sensor 13 is located in the radome (not shown) of a radar system. Here, the receiving optical components 12 include a lens and a series of mirrors in a Cassegranian arrangement. Radiation 11a, 11b, incident on the receiving optical components 12, is directed by receiving optical components 12 to infrared sensor 13, and in particular such radiation 14 is directed to an infrared window 15 of infrared sensor 13.

The infrared window 15 is comprised of a material which is transparent to a portion of wavelengths within the infrared spectrum. Here the window 15 is comprised of germanium and is transparent to infrared radiation having wavelengths between approximately 2.0 and 13.0 micrometers and allows a minimum of 90% transmission of infrared electromagnetic radiation within this range of wavelengths. The germanium window 15 has a conventional multilayer thin film surface which may be referred to as an "anti-reflection" surface and optimizes the transmission of radiation within the above mentioned range of wavelengths by minimizing reflection. Thus, infrared radiation 16 with wavelengths between approximately 2.0 and 13.0 micrometers passes through germanium infrared window 15 and is directed to an optical subassembly 50.

Optical subassembly 50 includes: a metal plate 17 which has two apertures 20, 27 disposed therethrough, two optical filters 19, 28 disposed behind and adhered to metal plate 17, and a metal baffle 25 disposed between the two optical filters 19, 28. The infrared radiation 16 is directed through apertures 20 and 27 which define and direct the incident radiation 16 to the optical filters 19, 28 respectively. The size of apertures 20, 27 is selected in accordance with the arrangement of infrared sensitive detectors 21, 30, which are disposed behind the optical subassembly 50, in order to direct the incident infrared radiation 16 from a given scene, or field of view, onto the entire surface area of infrared sensitive detectors 21, 30. Here, aperture 20, disposed in front of mid-wave filter 19, is 0.042 inches wide and 0.292 inches long, and aperture 27, disposed in front of long-wave filter 28, is 0.046 inches wide and 0.296 inches long. The slight difference in aperture size is a function of the difference in the vertical planes on which the infrared detectors 21, 30 are disposed as will be described. Filter 19 is here comprised of germanium, approximately 0.0218 inches thick, and has a longpass response allowing radiation with wavelengths greater than approximately 3.0 micrometers to pass through. Filter 28 is here also comprised of germanium with a thickness of approximately 0.0255 inches and has a bandpass response permitting radiation with wavelengths between approximately 8.0 and 10.0 micrometers to pass through.

Disposed between mid-wave filter 19 and bandpass filter 28 is a metal baffle 25. The baffle 25 minimizes optical crosstalk which is the occurrence of out-of-band radiation incident on infrared sensitive detectors 21, 30. Out-of-band radiation for infrared sensitive detectors 21, 30 refers to radiation which did not pass through the appropriate filter 19, 28 respectively. Here, out-of-band radiation, with respect to infrared sensitive detector 21, is radiation which did not pass through longpass filter 19 or equivalently radiation with wavelengths less than approximately 3.0 micrometers. With respect to infrared sensitive detector 30, out-of-band radiation refers to radiation which did not pass through bandpass filter 28 or equivalently radiation with wavelengths greater than approximately 10.0 micrometers or less than approximately 8.0 micrometers.

The mid-wave infrared radiation 18 which passes through optical filter 19 is directed to mid-wave infrared sensitive detector 21. Mid-wave detector 21 includes a staggered linear arrangement, or array, of a plurality of photosensitive elements which convert heat, or infrared electromagnetic radiation 18, into electrical energy. Here, the photosensitive elements are photodiodes which are photon detectors responding in proportion to the number of infrared photons within a range of wavelengths, a limit of such range corresponding to the minimum photon energy necessary to surmount the bandgap of the material of the photodiodes to provide electric current. Thus, each photodiode element of detector array 21 creates an electric current, or signal, corresponding to the intensity of incident infrared radiation 18.

Here, mid-wave detector array 21 includes 128 photodiodes comprised of indium antimonide (InSb). The material of the photosensitive elements is determined by the wavelengths of radiation to be detected. Photon energy is a function of Planck's constant (h) and the frequency ($v$) associated with the photon, such frequency being inversely proportional to the wavelength. Here, the region of wavelengths to which the photodiodes of mid-wave detector array 21 are responsive is between approximately 0 and 5.5 micrometers, with the wavelength limit of 5.5 micrometers corresponding to the minimum photon energy necessary to surmount the bandgap of indium antimonide, and thus provide current flow. Thus, due to the range of wavelengths to which InSb photodiodes are responsive, InSb is suitable for mid-wave infrared radiation detection; however, alternate materials being responsive to suitable ranges of wavelengths may alternately be used.

The size of the mid-wave detector array 21 is determined by inter alia the number of photosensitive elements and the size of each element. The size of each photosensitive element is determined primarily by the desired resolution and the number of such elements is determined primarily by the desired scene or field of view.

The long-wave infrared radiation which passes through optical filter 28 is directed to long-wave infrared sensitive detector 30. Long-wave detector 30 includes a staggered linear arrangement, or array, of a plurality of photosensitive elements, each of which provides an electric current, or signal, corresponding to the intensity of incident infrared radiation 29. Here, the photosensitive elements are photodiodes and respond in proportion to the number of infrared photons within a range of wavelengths, a limit of such range corresponding to the minimum photon energy necessary to surmount the bandgap of the material of the photoconductive elements.

Here long-wave detector array 30 includes 128 photodiodes comprised of mercury cadmium telluride (HgCdTe). The range of wavelengths to which long-wave detector 30 is responsive is between approximately 0.7 to 11.0 micrometers, with the limit of 11.0 micrometers corresponding to the minimum photon energy necessary to surmount the bandgap of the material. The bandgap and hence the wavelength responsivity of HgCdTe can be adjusted by adjusting the composition of the material and here the composition is $Hg_xCd_{1-x}Te$ with x equal to approximately 0.2.

Similar to mid-wave detector array 21, the number of long-wave photosensitive elements and their size determines the size of the detector array 30 with the size of photodiodes being a function of the desired resolution and the number of photodiodes being a function of the desired field of view.

The output of mid-wave detector array 21 includes 128 individual signal lines, each signal line carrying a signal corresponding to the intensity of incident radiation 18 on one of the 128 InSb photodiode elements of mid-wave detector array 21. The 128 signals are divided into two groups of sixty-four signals which, via signal lines 22a and 22b, feed the sixty-four inputs of multiplexer integrated circuits 23 and 24, respectively. Each of signal lines 22a and 22b thus represents 64 individual signals.

Similarly, the output of long-wave detector array 30 includes 128 individual signal lines, each signal line carrying a signal corresponding to the intensity of incident radiation 29 on one of the 128 HgCdTe photodiode elements of long-wave detector array 30. The 128 signals are divided into two groups of sixty-four signals which feed the sixty-four inputs of multiplexers 32, 33 via signal lines 31a and 31b, respectively.

Here, multiplexers 23, 24, 32, 33 are purchased from Amber Engineering of Goleta, Ca. (product AE-113). Multiplexers 23, 24, 32, 33 accept analog input signal levels, have digital control signals, and provide an output having digital timing and an analog signal level. In addition to the sixty-four inputs to each of multiplexers 23, 24 and 32, 33 provided by detector arrays 21, 30, an electronics unit 26, located external to infrared sensor 13, provides additional inputs to multiplexers 23, 24 and 32, 33. The external electronics unit 26 also conventionally processes the output signals from multiplexers 23, 24 32, 33 to provide interpretable, useful information regarding the presence, distribution, location and direction of objects within the field of view of the sensor 13.

The input signals fed to each of multiplexers 23, 24 and 32, 33 from electronics unit 26 are: DC power, here +10 volts, a reference potential, here GND or 0 volts, two synchronizing signals, and a clock signal. Here synchronizing signals SYNCA, SYNCB, and clock signal CLOCK1 feed multiplexers 23 and 24 and synchronizing signals SYNCC, SYNCD and clock signal CLOCK2 feed multiplexers 32 and 33. The synchronizing signals control the rate at which the sixty-four inputs to multiplexers 23, 24, 32, 33 are sampled to provide the output signals 35, 36, 37, 38 respectively as will be described. Each of the two synchronizing signals SYNCA, SYNCB, and SYNCC, SYNCD fed to multiplexers 23, 24, and 32, 33 respectively, represent different sampling frequencies. Only one of the synchronizing signals controls the frequency at which the sixty-four input signals of the multiplexers 23, 24, 32, 33 are sampled to provide the output of multiplexers 23, 24, 32, 33 at a given time.

Multiplexers 23, 24, 32, 33 each have one output 35, 36, 37, 38 respectively and thus may be referred to as 64:1 multiplexers. In each of the multiplexers 23, 24, 32, 33, the output 35, 36, 37, 38 respectively is a serial data steam including sixty-four pulses, with each pulse corresponding to one of the sixty-four input signals and in particular having a magnitude corresponding to the intensity of the incident infrared radiation on one of the photodiode elements of one of detector arrays 21, 30.

Multiplexer outputs 35, 36, 37, 38 feed electronics unit 26 which performs signal processing functions and may include an analog to digital converter. The information provided by outputs 35, 36, 37, 38 of multiplexers 23, 24, 32, 33 may be processed by any number of analog or digital techniques known in the art to provide useful, interpretable information regarding objects within the field of view of the sensor 13. Electronics unit 26 may either be fed multiplexer outputs 35, 36, 37, 38 directly or alternately multiplexer outputs 35–38 may be conditioned by a line driving buffer 39 which in turn feeds electronics unit 26. Here a hybridized line driving buffer 39, containing integrated circuits, passive components, and electrical interconnections is used and has four gain channels, one for each of the four multiplexer outputs 35–38. Buffer 39 provides gain choices adjustable by bond wire jumpering, and also provides the capability to apply a common offset voltage to each channel so that the outputs 35a–38a of the buffer 39 are isolated signals having driving capability suitable for a variety of signal processing operations.

Infrared sensor 13 includes a temperature sensor 47 to indicate to the electronics unit 26 whether the temperature of the sensor 13 is acceptable. Here a 1N914 silicon diode integrated circuit is used; however, other types of temperature sensors may alternately be used. Electronics unit 26 provides a constant current to the temperature sensitive diode 47 via signal line 47a. The voltage across the diode 47 varies as a function of temperature. Temperature sensor 47 provides a signal to electronics unit 26 via signal line 47b indicative of the voltage across the diode and thus of the temperature.

Figure 2:
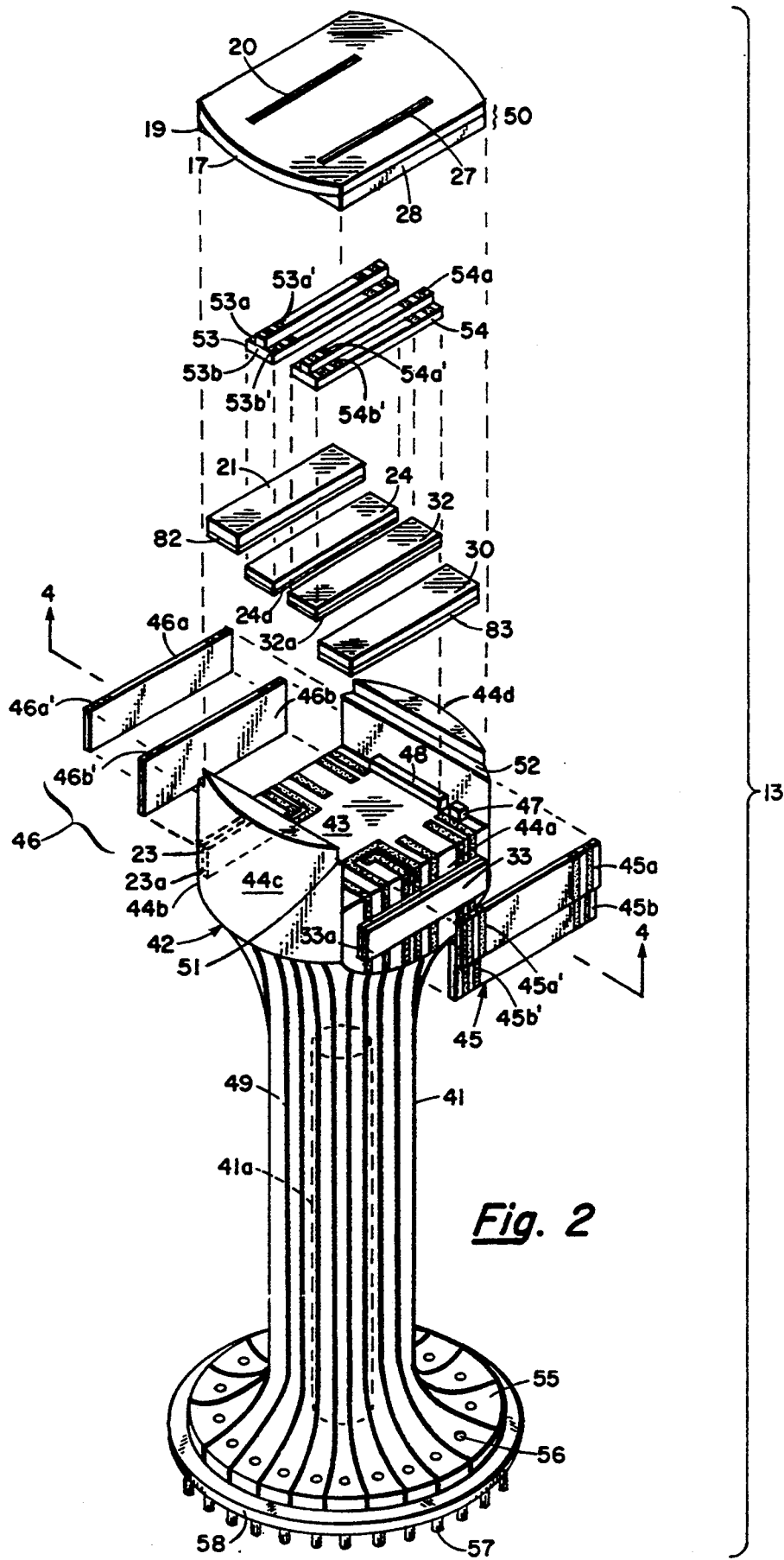
FIG. 2 is an exploded isometric view of a dual-band infrared sensor in accordance with the present invention.

Referring now to FIG. 2, a dual-band infrared sensor 13 having mid-wave and long-wave infrared detection capabilities includes a support member 42. Support member 42 is often referred to as the "cold finger" and has a cylindrical shaft portion 41 and a first, flared end 55 in which is disposed a cavity 41a. The support member 42 further includes, at a second end, a platform 43, such platform 43 having at least one, and here a pair of sides 44a, 44b, such sides being non-coplanar with the platform 43. Preferably, the planes of the platform 43 and the at least one side intersect, and more preferably such planes are perpendicular to one another. Support member 42 further includes, at the second end, curved sidewall portions 44c, 44d which have ledge portions 51 and 52 as shown. Support member 42 is here comprised of glass and has conductors 49 disposed thereon to provide connections to circuitry disposed over platform 43, sides 44a, 44b and external electronics unit 26 (FIG. 1). Here, the conductors 49 are comprised of gold, nickel, and titanium and are provided by sputtering a thin adhesion layer of titanium over glass support member 42, followed by a thin barrier layer of nickel, a thin highly conductive layer of gold, and then electroplating selected portions of support member 42 with gold. The portions of support member 42 which are electroplated are those over which wire bond connections will be made. Here, the gold, nickel, and titanium are then laser scribed to provide conductors 49 as shown; however alternate techniques such as etching may be used to provide conductors 49.

Conductors 49 provide the signal lines for input signals to multiplexers 23, 24, 32, and 33, from electronics unit 26 as well as signal lines for outputs from multiplexers 23, 24, 32, and 33 as will be described. Conductors 49 are provided over the platform 43 and sides 44a, 44b of support member 42 and are disposed along the length of cylindrical shaft 41 to flared end 55 of support member 42. At the flared end 55, conductors 49 are individually electrically coupled to ends 56 of connector pins 57. Here, twenty-four connector pins 57 extend from flared end 55 to provide connection points from infrared sensor 13 to radiation detection system 34 and in particular to electronics unit 26 (FIG. 1). Disposed peripherally around flared end 55 is a metal rim or flange 58 which provides a suitable surface to mate with a cover for infrared sensor 13 as will be described in conjunction with FIG. 2A.

Disposed over platform 43 of support member 42 is mid-wave detector array 21 and long-wave detector array 30. The vertical planes on which mid-wave detector array 21 and long-wave detector array 30 are disposed, are offset from one another. Since detector arrays 21 and 30 share a single set of receiving optics 12 (FIG. 1) and are responsive to different ranges of wavelengths, they have different focal lengths, or horizontal planes at which images will be focused. Here, insulating shims 82 are used to elevate mid-wave detector array 21 to a height of 0.006 inches above the height of long-wave detector array 30, such longwave detector array 30 being disposed on shims 83.

Also disposed over platform 43 are two multiplexer integrated circuits 24, 32. Multiplexers 24, 32 are disposed adjacent to one another, on insulating shims 24a, 32a, and between detector arrays 21, 30 respectively. As described in conjunction with FIG. 1, the 128 signals provided by mid-wave detector array 21 are divided into two groups of sixty-four signals with a first group feeding the sixty-four inputs of multiplexer 24. Similarly, the 128 signals provided by long-wave detector array 30 are divided into two groups of sixty-four signals with a first group feeding the sixty-four inputs of multiplexer 32. The sixty-four input bond pads of multiplexers 24, 32 fed by detector arrays 21, 30 respectively are disposed along the edges of multiplexers 24, 32 which are adjacent to one another (see FIG. 3). The bond pads providing connections for external input signals to and output signals from multiplexers 24, 32 are disposed along the opposite edges of multiplexers 24, 32, adjacent to mid-wave and long-wave detector arrays 21, 30 respectively (see FIG. 3). The output bond pads of multiplexers 24, 32 are connected via wire bonds (FIG. 4) to gold conductors 49 disposed on platform 43 of support member 42 as will be described further in conjunction with FIG. 4.

Interconnecting members 53 and 54 are disposed over platform 43 of glass support member 42 and are used to route wire bond connections (see FIG. 4) between bond pads of detector arrays 21 and 30 and inputs of multiplexers 24 and 32, respectively. Specifically, interconnecting member 53 is used to route wire bond connections between sixty-four of the 128 signals provided by mid-wave detector array 21 and the sixty-four inputs to multiplexer 24. Similarly, interconnecting member 54 is used to route wire bond connections between sixty-four of the 128 signals provided by long-wave detector array 30 and the sixty-four inputs to multiplexer 32.

Interconnecting members 53 and 54 include dielectric ceramic substrates 53a, 53b and 54a, 54b in a two level parallel tier arrangement with each substrate tier 53a, 53b and 54a, 54b having thirty-two conductors 53a', 53b', and 54a', 54b' disposed thereon parallel to one another. The sixty-four signals routed between mid-wave detector array 21 and the sixty-four inputs to multiplexer 24 are divided into two groups of thirty-two signals with a first group routed via the parallel conductors 53a' of the upper tier 53a of interconnecting member 53 and a second group routed via the parallel conductors 53b' of the lower tier 53b of interconnecting member 53. Similarly, the sixty-four signals routed between long-wave detector array 30 and the sixty-four inputs of multiplexer 32 are divided into two groups of thirty-two signals with a first group routed via the parallel conductors 54a' disposed on the upper tier 54a of interconnecting member 54 and a second group routed via the parallel conductors 54b' disposed on the lower tier 54b of interconnecting member 54.

Spacing members 48 (only one of which is shown) are disposed over platform 43 of support member 42 and are used to position interconnecting members 53 and 54 over portions of multiplexers 24 and 32 respectively.

Disposed over a first one 44a of the pair of sides 44a, 44b of support member 42 is interconnecting member 45 and, on insulating shims 33a, multiplexer 33. The sixty-four inputs of multiplexer 33 are fed by a second, remaining group of sixty-four signals provided by long-wave detector array 30. Interconnecting member 45 is used to route the sixty-four wire bond connections between long-wave detector array 30 and multiplexer 33.

Disposed over the second one 44b of the pair of sides 44a, 44b of support member 42 is interconnecting member 46 and, over insulating shims 23a, multiplexer 23. The sixty-four inputs of multiplexer 23 are fed by a second, remaining group of sixty-four signals provided by mid-wave detector array 21. Interconnecting member 46 is used to route the sixty-four wire bond connections between mid-wave detector array 21 and multiplexer 23.

Interconnecting members 45 and 46 include dielectric ceramic substrates 45a, 45b, and 46a, 46b in a two level parallel tier arrangement with each substrate tier 45a, 45b and 46a, 46b having thirty-two conductors 45a', 45b', and 46a', 46b' respectively disposed thereon parallel to one another. Conductors 45a', 45b', 46a', 46b' are disposed on two perpendicular planes of substrates 45a, 45b, 46a, 46b with right angle metalization disposed between the metalization on the two planes. The right angle metalization of interconnecting members 45 and 46 allows one set of wire bonds in the plane of the platform 43 of support member 42 and a mating set of wire bonds in the, here perpendicular, plane of sides 44a, 44b to be reliably interconnected. Thus, interconnecting members 45 and 46 permit a three dimensional arrangement of detector arrays 21 and 30 and multiplexers 23, 24, 32, and 33 while providing reliable interconnections.

It should be noted that multiplexers 24, 32, 23 and 33 are, here, provided on insulating shims over platform 43 and sides 44a, 44b respectively; however, multiplexers 24, 32, 23, and 33 may alternately be disposed on an dielectric carrier which in turn is disposed on the platform 43 and sides 44a, 44b. Such a carrier is used to facilitate removal of faulty multiplexers 23, 24, 32, 33 without damaging either the multiplexers 23, 24, 32, 33 or the conductors 49 which are disposed under such devices. Here, the carriers used (not shown) are fitted with screws which extend substantially through the carrier. In order to remove the carrier, the screws are turned to contact the platform 43, such contact providing the necessary force to remove the carrier.

As previously mentioned, cylindrical shaft 41 of support member 42 has a cavity 41a disposed therein. Infrared detector arrays 21 and 30 are cooled by means of a conventional cryogenic cooler (not shown) disposed within the cavity 41a of cylindrical shaft 41. Detector arrays 21 and 30 should be maintained at a relatively low temperature to provide effective infrared detection. Here, the preferred temperature is approximately 77° K. The cryogenic cooler is here comprised of a mandrel about which is wrapped a finned tube. The tube is finned in order to maximize heat exchange efficiency. Cooling gas is directed through the finned tube at relatively high pressure. Once expelled from the tube, towards the inner surface 41b (see FIG. 4) of the platform 43, the cooling gas expands and cools to maintain infrared detectors arrays 21 and 30 at a suitably low temperature. Examples of suitable cooling gases are nitrogen and argon. The cryogenic cooler using nitrogen gas cools the platform 43 to a temperature between approximately 77° K. and 85° K. Argon gas has similar properties of cooling when expanded; however, although argon gas provides the advantages of faster cooling and lower gas volume than nitrogen, argon cools the platform 43 to a temperature of approximately 10° K. higher than nitrogen, or between approximately 87° K. and 95° K. The temperature indicating signal provided by the temperature sensor 47 (FIG. 1) may be used to regulate the flow of the cooling gas in the cryogenic cooler.

Optical subassembly 50 is disposed over the platform 43 of support member 42, here adhered onto ledge portions 51 and 52 of curved sidewall portions 44c and 44d. Optical subassembly 50 includes a metal plate 17 through which are disposed two apertures 20, 27, optical filters 19 and 28, and metal baffle 25, as previously described in conjunction with FIG. 1.

Figure 2A:
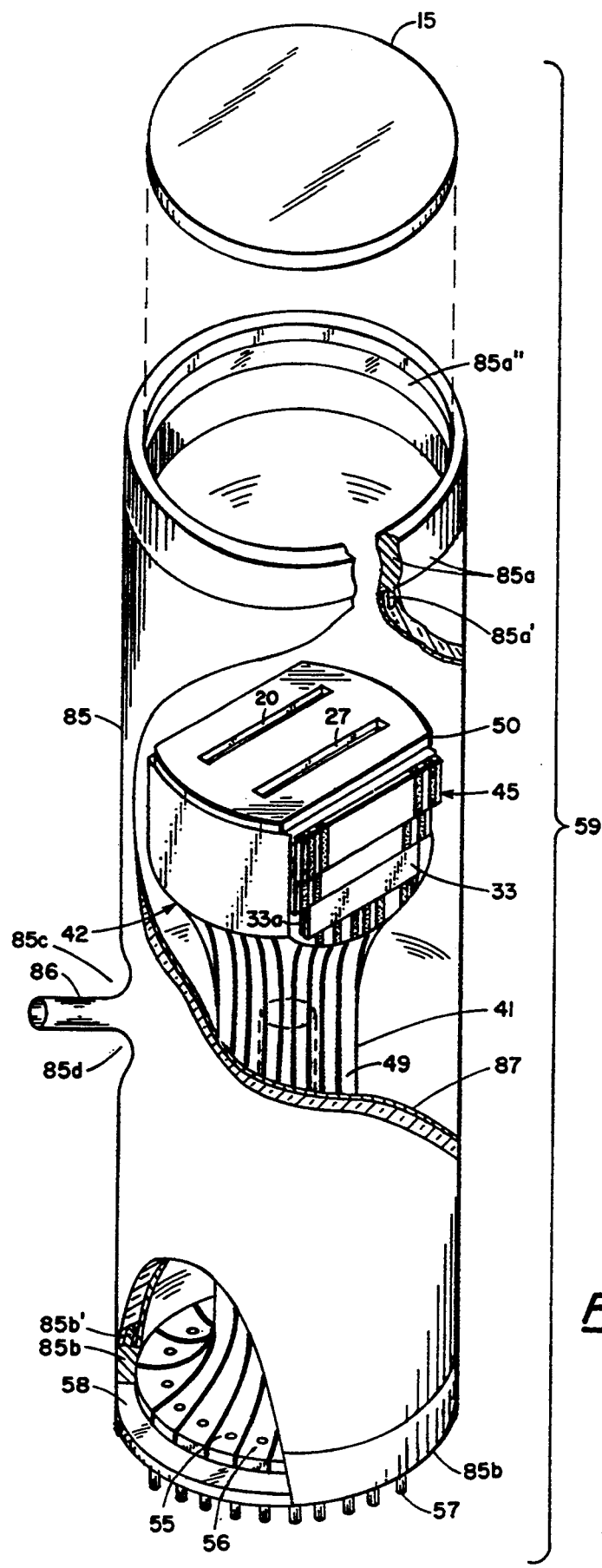
FIG. 2A is the infrared sensor of FIG. 2 in a vacuum sealed package.

Referring now to FIG. 2A, the infrared sensor 13 described in conjunction with FIG. 2 has disposed thereover cylindrical glass cover 85 to provide a vacuum sealed infrared sensor 59. Glass cover 85 has upper and lower metal portions 85a, 85b respectively, each of which has a portion 85a', 85b' shaped to have glass cover 85 formed thereover. The lower metal portion 85b of glass cover 85 is disposed over and attached to flange 58 of flared end 55 of support member 42 as shown in the lower broken away portion of glass cover 85. Lower metal portion 85b may be attached to flange 58 by conventional techniques such as soldering or laser welding. The upper metal portion 85a of glass cover 85 has an inner rim 85a'' over which germanium window 15 (FIG. 1) is disposed. Here, germanium window 15 is selectively metallized adjacent to its outer edge and then soldered onto inner rim 85a'' of upper metal portion 85a of glass cover 85.

The glass cover 85 has a tube extension 86 extending therefrom, through which a vacuum pump is attached to evacuate the unit 59 to provide near vacuum conditions. Once pressure within the unit 59 has been reduced to a suitable level, the vacuum pump remains attached and the unit 59 is baked to remove contaminants trapped under the cover 85. The glass extension 86 is then heated to melt the glass and seal the unit 59 after which the unit 59 is annealed to provide suitable mechanical strength. A stub will extend from the cover 85 where extension 86 is removed. It is noted that indentations 85c and 85d may be provided in glass cover 85 adjacent to tube extension 86 to effectively cause the remaining stub of extension 86 to protrude less from the cover 85.

The inner surface 87 of glass cover 85 is metallized to insulate the covered unit 59 and reduce radiated heating by providing a surface with relatively low emissivity. The entire covered, vacuum sealed unit 59 is disposed in a metal housing for compatibility with infrared detection system 34 (FIG. 1) as will be described in conjunction with FIG. 5.

Figure 3:
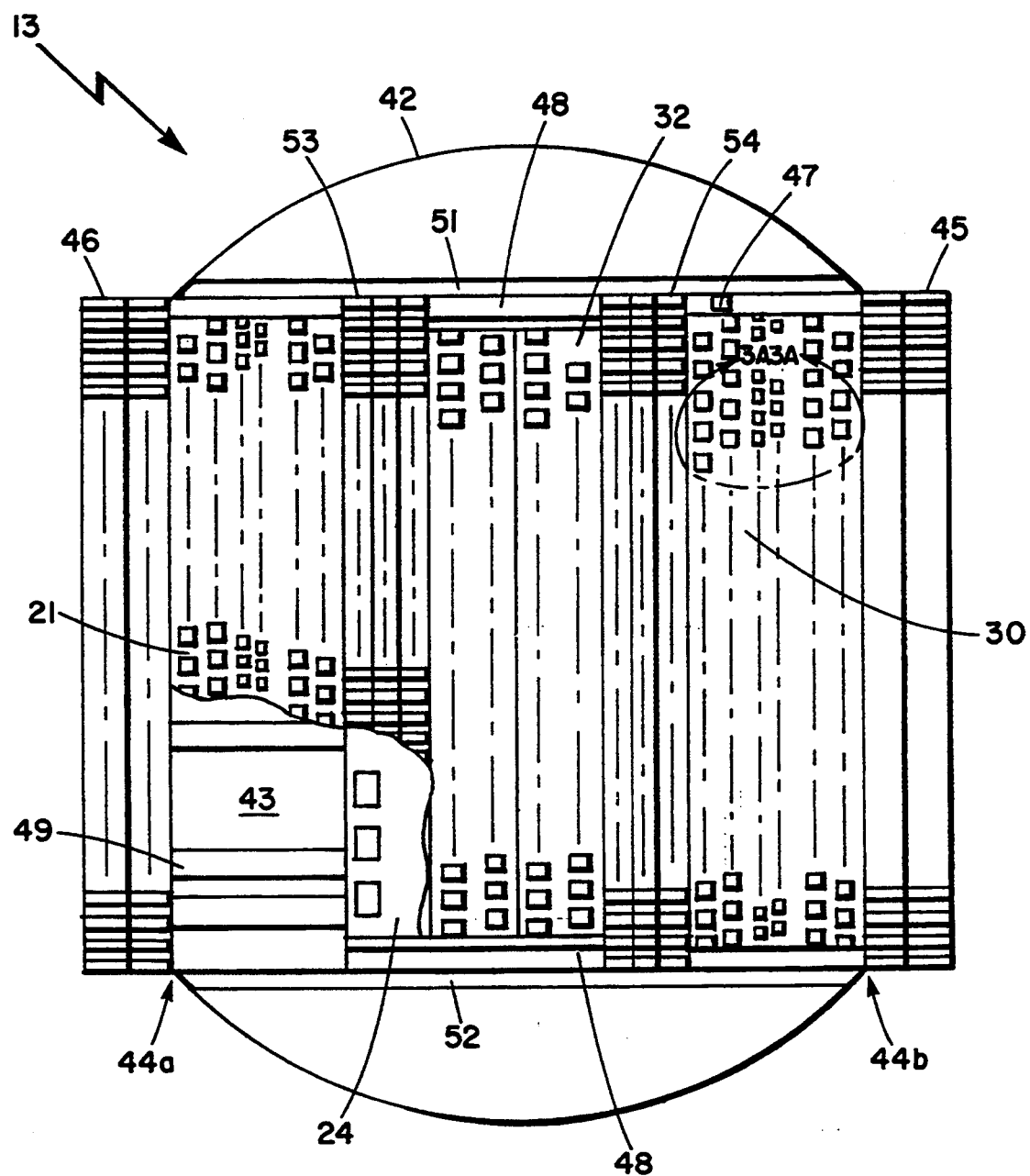
FIG. 3 is a plan view of the infrared sensor of FIG. 2 partially broken away.

Referring now to FIG. 3, a partially broken away plan view of the infrared sensor 13 of FIG. 2 is shown without optical subassembly 50 and wire bond connections for clarity. Platform 43 of support member 42 has sides 44a and 44b non-coplanar with the platform 43 and support member 42 has disposed thereon gold conductors 49 as described in conjunction with FIG. 2. Platform 43 further includes curved sidewall portions 44c and 44d which have ledge portions 51 and 52 over which optical subassembly 50 is disposed (not shown). Disposed over sides 44a, 44b of support member 42 are interconnecting members 45 and 46 and multiplexers 23 and 33 respectively (see FIG. 2).

Disposed over platform 43 of support member 42 are detector arrays 21 and 30 and multiplexers 24 and 32 as described in conjunction with FIG. 2. Also disposed over platform 43 are interconnecting members 53 and 54 which are supported by spacing members 48 to elevate interconnecting members 53 and 54 above portions of multiplexers 24 and 32 respectively, so that wire bond connections can be made to multiplexers 24 and 32. As seen in the broken away portion of detector array 21 and interconnecting member 53, multiplexer 24 extends underneath interconnecting member 53.

Figure 3A:
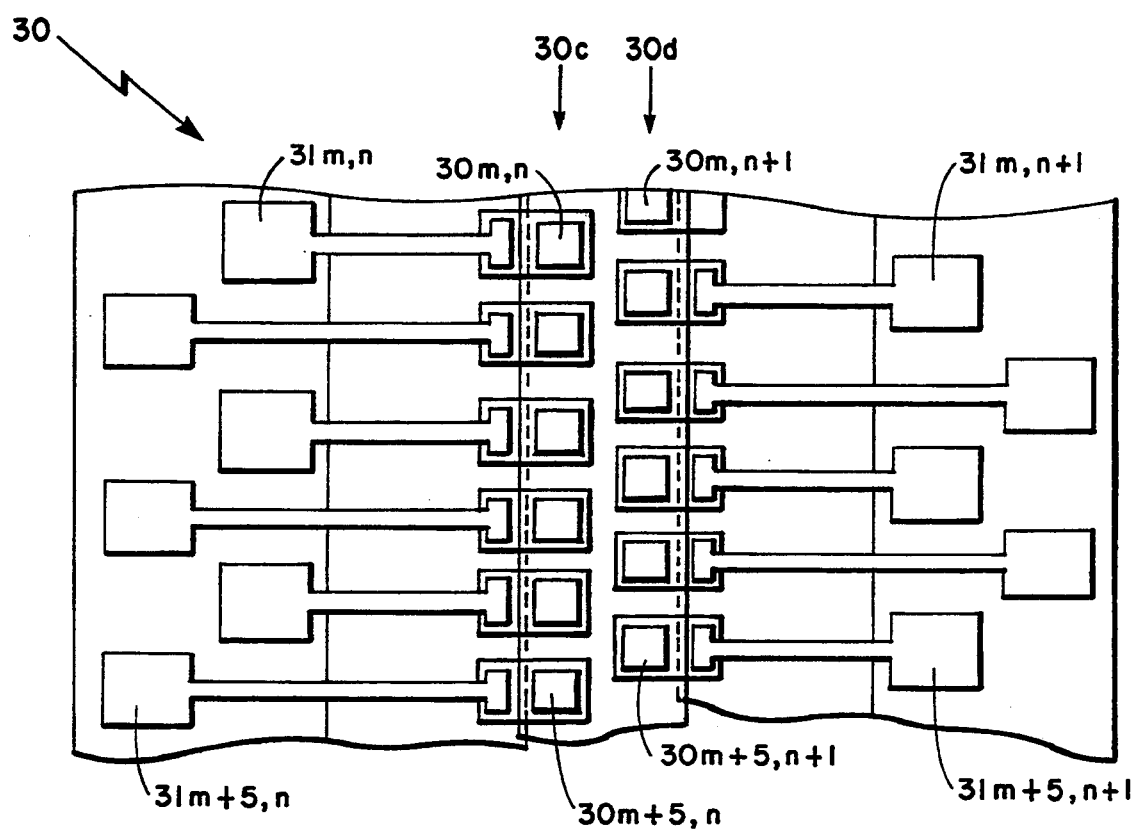
FIG. 3A is an enlarged plan view of an infrared detector array taken along line 3A—3A of FIG. 3.

Referring now to FIG. 3A, an enlargement of a portion of the HgCdTe long-wave detector array 30 includes a linear arrangement of photosensitive elements, here photodiodes, responsive to infrared radiation with wavelengths between approximately 0.7 and 11.0 micrometers. A similar arrangement of photodiodes is provided on the indium antimonide mid-wave infrared detector array 21. Here, long-wave detector array 30 is 0.08 inches wide, 0.29 inches long and includes 128 individual photodiode elements. The photodiodes are provided in a staggered configuration in order to accommodate the 128 elements within the mechanical constraints dictated by the radiation detection system 34 (FIG. 1).

As shown on the portion of HgCdTe detector array 30 of FIG. 3, each photodiode includes an optically active region $30_{m,n}$ to $30_{m+5,n+1}$ which is approximately a fifty micrometer square, with each square on 100 micrometer centers within rows 30c, 30d and 100 micrometer separation between the centers of rows 30c, 30d. Each optically active region $30_{m,n}$ to $30_{m+5,n+1}$ is electrically connected to a corresponding bond pad $31_{m,n}$ to $31_{m+5,n+1}$, respectively through which individual electrical connections are made. The optically active regions $30_{m,n}$ to $30_{m+5,n+1}$ are p-n junctions and have bandgaps surmounted by radiation with a specified photon energy as described in conjunction with FIG. 1.

Wire bonds are provided from bond pads, for example bond pads $31_{m,n}$ to $31_{m+5,n+1}$, to the sixty-four inputs of each of multiplexers 23, 24, 32, 33 and are routed via interconnecting members 53, 54, 45, and 46 as previously described.

Detector arrays 21, 30 are fabricated as continuous strings from which a string of 128 elements is diced from a longer string to provide detector arrays 21, 30. A clearance of approximately 0.020 inches is provided at each end of detector arrays 21, 30 in order to minimize any performance degradation due to dicing and handling. It is noted that here, detector arrays 21, 30 are provided with a thin metal layer over side and bottom surfaces in order to reduce the occurrence of stray radiation entering the detectors 21, 30 via such surfaces. Here, such metal layers are provided by the technique of sputtering; however, alternate techniques and various metal systems, for example titanium/nickel/gold or chrome/gold may be used.

The performance of detector arrays 21, 30 is measured by the parameters of detectivity, which refers to the sensitivity of the detectors 21, 30 per amount of incident infrared radiation, and responsivity, which refers to the output signal power capability of the detector arrays 21, 30 per amount of incident infrared radiation. Here, operating at a multiplexer clock frequency of 25 KHz, the average detectivity of the InSb mid-wave detector array 21 is greater than approximately $7.0 \times 10^{10}$ cm(Hz$^{\frac{1}{2}}$)/watt, and the average responsivity of detector array 21 is greater than approximately 2.0 amps/watt. Operating with the same multiplexer clock frequency of 25 KHz, the HgCdTe long-wave detector array 30 has an average detectivity greater than approximately $4.0 \times 10^{10}$ cm(Hz$^{\frac{1}{2}}$)/watt, and the average responsivity of detector array 30 is greater than approximately 4.0 amps/watt. It should be noted that the detectivity and responsivity are dependent on inter alia the clock frequency and therefore can be somewhat adjusted by varying the clock frequency. The levels of detectivity and responsivity for both the mid-wave and long-wave detector arrays 21, 30 are conventional and demonstrate that the incorporation of two bands of infrared detection in a single sensor 13 causes no degradation in detector array performance over infrared sensors having only single band detection capability.

Figure 4:
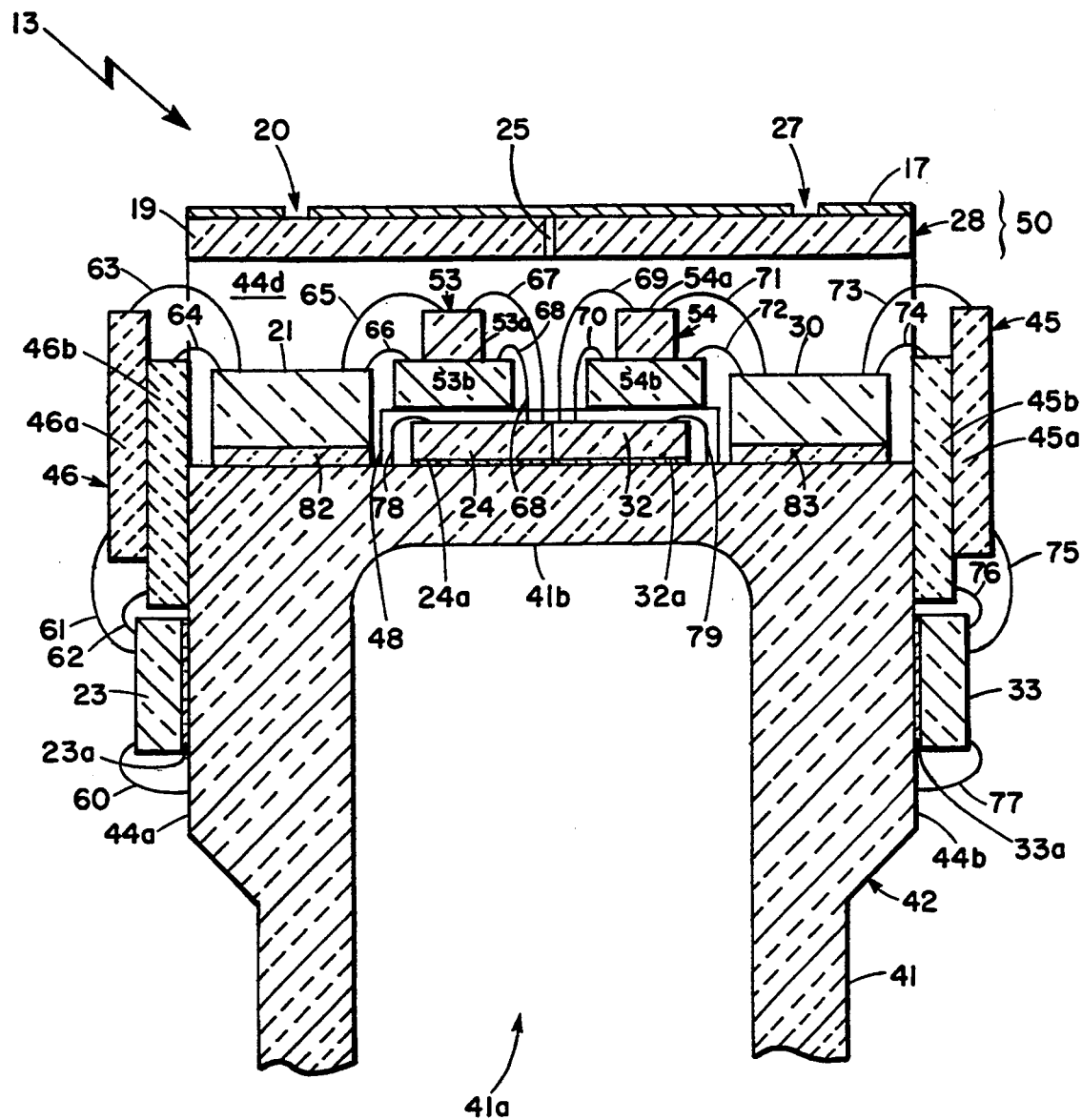
FIG. 4 is a somewhat diagrammatical cross-sectional view of the infrared sensor taken along line 4—4 of FIG. 2, showing interconnections of the components of the infrared sensor.

Referring now to FIG. 4, infrared sensor 13 includes simplified wire bond connections between components. As described in conjunction with FIG. 2, disposed over platform 43 of support member 42 are: mid-wave detector array 21, long-wave detector array 30, multiplexers 24 and 32, and interconnecting members 53 and 54. Disposed over the pair of sides 44a, 44b of support member 42 are multiplexer 23 and interconnecting member 46, and multiplexer 33 and interconnecting member 45, respectively.

Both mid-wave detector array 21 and long-wave detector array 30 are disposed on shims 82, 83 respectively to elevate detector arrays 21, 30 to the optimal horizontal plane for focusing objects within the field of view of infrared sensor 13. Here shims 82 disposed under mid-wave detector array 21 and shims 83 disposed under long-wave detector array 30 have a thickness of between approximately 0.005 and 0.01 inches, such that mid-wave detector array 21 is 0.006 inches closer to optical subassembly 50 than long-wave detector array 30. Also, multiplexers 23, 24, 32, 33 are disposed on shims 23a, 24a, 32a, 33a having a thickness of approximately 0.010 inches to provide electrical insulation between the multiplexers 23, 24, 32, 33 and the conductors 49.

Interconnecting members 53 and 54 are disposed over, but not in contact with, portions of multiplexers 24 and 32 respectively, and are elevated and supported by spacing members 48 (FIG. 2). Optical subassembly 50 including: longpass mid-wave filter 19, bandpass long-wave filter 28, metal baffle 25, and metal plate 17 having apertures 20 and 27 disposed therethrough, is disposed over platform 43 of support member 42. Optical subassembly 50 is supported by ledge portions 51, 52 of curved sidewall portions 44c, 44d of support member 42 (FIG. 2).

The sixty-four inputs of multiplexer 23 are fed by a first group of sixty-four signals provided by mid-wave detector array 21 and are routed from bond pads (FIG. 3A) of detector array 21 to the inputs of multiplexer 23 via interconnecting member 46. As previously described, interconnecting member 46 includes dielectric ceramic substrates 46a, 46b in a two level parallel tier arrangement with each substrate 46a, 46b having thirty-two right angle conductors 46a', 46b' (FIG. 2) disposed thereon to provide reliable bonds from the plane of platform 43 to the, here perpendicular, plane of side 44a. Therefore, the sixty-four signals connected between mid-wave detector array 21 and multiplexer 23 are further divided into two groups of thirty-two signals, the first group of which is electrically connected via wire bonds 63 to the first substrate tier 46a of interconnecting member 46 and a second group of which is connected via wire bonds 64 to the second substrate tier 46b of interconnecting member 46. Thus wire bonds 63, 64 each represent thirty-two individual wires. The thirty-two signals of wire bonds 63 are routed via right angle metalization along parallel conductors 46a' (FIG. 2) of interconnecting member 46 and the thirty-two signals of wire bonds 64 are routed via right angle metalization along parallel conductors 46b' (FIG. 2) of interconnecting member 46. Wire bonds 61 and 62, each representing 32 individual wire connections, carry signals from interconnecting member 46 to the sixty-four inputs of multiplexer 23 as shown.

With this arrangement, interconnecting member 46 provides reliable connections between components disposed over the plane of platform 43 and components disposed over side 44a, by eliminating individual wires which originate and terminate on non-coplanar, and here non-parallel, surfaces.

The external input signals to and output signals from multiplexer 23 are carried by wire bonds 60 to gold conductors 49 which are disposed on support member 42 as previously described.

The second, remaining group of sixty-four signals provided by mid-wave detector array 21 are similarly divided into two groups of thirty-two signals, a first group of which is carried by wire bonds 65 to the first substrate tier 53a of interconnecting member 53, and a second group of which is carried by wire bonds 66 to the second substrate tier 53b of interconnecting member 53. Each of substrate tiers 53a, 53b of interconnecting member 53 have thirty-two parallel conductors 53a', 53b' (FIG. 2) disposed thereon. The signals connected between mid-wave detector array 21 and multiplexer 24 and carried by wire bonds 65 and 66, are routed along conductors 53a', 53b' (FIG. 2) of interconnecting member 53 to wire bonds 67 and 68 respectively, which carry the signals to the sixty-four inputs of multiplexer 24 as shown. The external input signals to and output signals from multiplexer 24 are routed via wire bonds 78 to gold conductors 49 disposed on platform 43 of support member 42. Interconnecting member 53 routes the connections between the second, remaining group of sixty-four signals provided by mid-wave detector array 21 and the sixty-four input signals of multiplexer 24 on two level parallel ceramic tiers. Routing sixty-four wires on two parallel ceramic tiers, as opposed to having sixty-four wires disposed in a single vertical plane, provides a wire bond arrangement which is less dense, and therefore the wires will be less prone to breakage or contacting adjacent wires. Thus, the resulting connections are mechanically and electrically more reliable. Further, this arrangement provided by interconnecting member 53 requires less surface area on platform 43 than would be required if multiplexer 24 were rotated 180° to have the sixty-four input bond pads adjacent to mid-wave detector array 21, since, with the latter arrangement, a larger clearance between the detector 21 and multiplexer 24 would be required to ensure reliability of the wire bond connections.

Similarly, the sixty-four inputs of multiplexer 33 are fed by a first group of sixty-four signals provided by long-wave detector array 30 and are routed via interconnecting member 45. Interconnecting member 45 includes dielectric ceramic substrates 45a, 45b in a two level parallel tier arrangement with each substrate 45a, 45b having thirty-two right angle conductors 45a', 45b' (FIG. 2) disposed thereon. Thus, the first group of sixty-four signals provided by longwave detector array 30 are further divided into two groups of thirty-two signals, of which a first group is carried by wire bonds 73 to the first substrate tier 45a of interconnecting member 45 and a second group of which is carried by wire bonds 74 to the second substrate tier 45b of interconnecting member 45. Thus, wire bonds 73 and 74 each represent thirty-two individual wire connections. The thirty-two signals of wire bonds 73 are routed via parallel right angle conductors 45a', and the thirty-two signals of wire bonds 74 are routed via parallel right angle conductors 45b' disposed on substrate tiers 45a, 45b respectively. Wire bonds 75 and 76, each carrying thirty-two signals are connected from conductors 45a', 45b' (FIG. 2) of interconnecting member 45 to the sixty-four inputs of multiplexer 33 as shown. The external input signals to and output signals from multiplexer 33 are carried by wire bonds 77 to gold conductors 49 which are disposed on support member 42.

The second, remaining group of sixty-four signals provided by long-wave detector array 30 are divided into two groups of thirty-two signals, a first group of which is carried by wire bonds 71 to the first substrate tier 54a of interconnecting member 54 and a second group of which is carried by wire bonds 72 to the second substrate tier 54b of interconnecting member 54. The signals carried by wire bonds 71 and 72 are routed along parallel conductors 54a', 54b' (FIG. 2) disposed on substrate tiers 54a, 54b to wire bonds 69 and 70 respectively, and to the sixty-four inputs of multiplexer 32 as shown. The external input signals to and output signals from multiplexer 32 are carried by wire bonds 79 to gold conductors 49 disposed on platform 43 of support member 42. Interconnecting member 54 thus allows the sixty-four connections between sixty-four signals provided by long-wave detector array 30 to the sixty-four inputs of multiplexer 32 on two vertical planes, thus making the wire bond arrangement less dense and therefore more mechanically and electrically reliable. Further, less surface area of platform 43 is required with the described arrangement than would be required if multiplexer 32 were rotated 180° to have the sixty-four inputs adjacent to long-wave detector array 30 since with the latter arrangement, a larger clearance would be required between detector array 30 and multiplexer 32 in order to ensure wire bond reliability.

Cavity 41a disposed within cylindrical shaft 41 of support member 42 houses a cryogenic cooler as previously described (not shown). The cooling gas which is pressurized by the cryogenic cooler is directed at the inner surface 41b of the platform 43 of support member 42.

Figure 5:
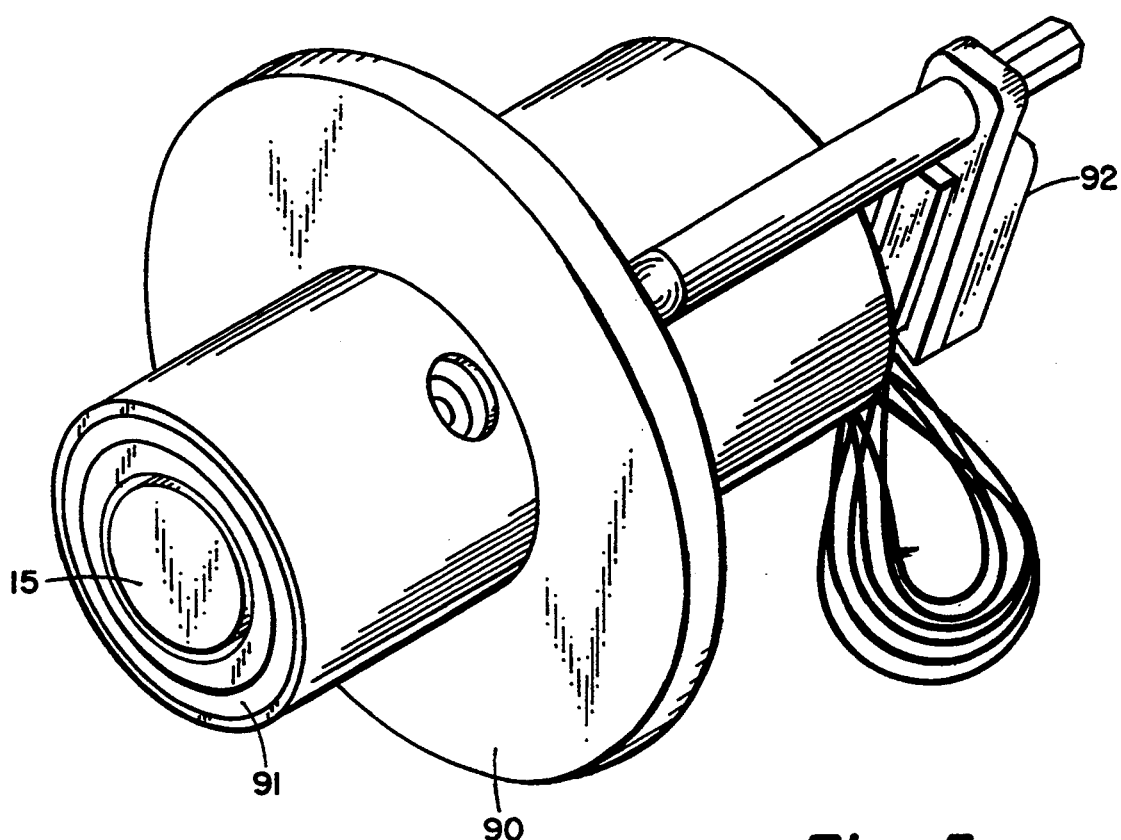
FIG. 5 is the vacuum sealed infrared sensor of FIG. 2A further packaged in a metal housing.

Referring now to FIG. 5, the vacuum sealed, covered infrared sensor unit 59 (FIG. 2A) is disposed in a metal housing 90 with germanium window 15 exposed. The dimensions of the metal housing 90 are a function of the radiation detection system 34 in which the sensor unit 59 is disposed and here such housing 90 is 1.0 inches by 1.85 inches. The sensor unit 59 is potted with a potting compound 91, here GE RTV511 provided by General Electric, Schenectady, N.Y. to provide the sensor unit 59 with mechanical stability by minimizing sensitivity to vibrations. Prior to applying the potting compound, a primer is applied to the covered unit 59 and the inside of the metal housing 90 to improve the adhesion to the potting compound. Here, GE 4004 primer provided by General Electric, Schenectady, N.Y. is used.

Disposed at the end of metal housing 90 opposite germanium window 15 is a connector 92 here a standard 21 pin female miniature connector, through which electrical connections are made between the external electronics unit 26 (FIG. 1) and infrared sensor 13.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. An electromagnetic radiation sensor package comprising:

a support member having a first flared end, with a cavity disposed in said first end substantially extending through the length of the member, said member further having a second end with a platform adaptable for supporting an electromagnetic radiation sensor and at least one planar side, said at least one planar side being non-coplanar with said platform, and having a pair of sidewall portions extending above said platform, wherein said platform is substantially perpendicular to the length of the support member and wherein each of the pair of sidewall portions has a ledge portion disposed above the platform.

2. The package recited in claim 1 further comprising a plurality of conductors and a plurality of pins extending from said first flared end, with said conductors being disposed in direct contact with said platform and extending substantially from said platform and terminating at said plurality of pins.

3. An infrared sensor comprising:

a support member having a first end, with a cavity disposed in said first end substantially extending through the length of the member, said member further having a second end with a platform and at least one side being non-coplanar with said platform, and having a pair of sidewall portions extending above said platform, wherein said platform is disposed substantially perpendicular to the length of said support member;

first means, disposed over the platform of the second end and responsive to electromagnetic infrared radiation having wavelengths within a first range of wavelengths, for providing a first plurality of signals corresponding to intensity of incident electromagnetic infrared radiation having wavelengths within said first range of wavelengths; and multiplexing means, disposed over the at least one side of the second end and having a plurality of inputs fed by signals provided by the first means, for providing at least one serial data stream corresponding to the signals provided by the first means.

4. The infrared sensor recited in claim 3 wherein each of said pair of sidewall portions has a ledge portion disposed above said platform and wherein the infrared sensor furthers comprises an optical filter supported by said Ledge portions.

5. The infrared sensor recited in claim 3 further comprising at least one interconnecting member disposed over the at least one side, said interconnecting member being electrically coupled to a portion of the first plurality of signals provided by the first means and the plurality of inputs to the multiplexing means.

6. The infrared sensor recited in claim 3 further comprising:

second means, disposed over the platform of the second end and responsive to electromagnetic infrared radiation having wavelengths within a second range of wavelengths, for providing a second plurality of signals corresponding to intensity of incident electromagnetic infrared radiation having wavelengths within said second range of wavelengths, and wherein said multiplexing means has a plurality of inputs provided by the first and second means for providing at least one serial data stream corresponding to the signals provided by the first and second means.

7. The infrared sensor recited in claim 3 wherein the support member has conductors disposed thereon, said conductors extending substantially from said first end to said second end.

8. The infrared sensor recited in claim 7 wherein the conductors are comprised of gold.

9. The infrared sensor recited in claim 3 wherein the first and second means each include a plurality of photodiodes.

10. An infrared sensor comprising:

a support member having a first end, with a cavity disposed in said first end substantially extending through the length of the member, said member further having a second end with a platform and at least one side non-coplanar with said platform;

means disposed over the platform of the second end and responsive to electromagnetic infrared radiation having wavelengths within a first and a second range of wavelengths, for providing a plurality of signals corresponding to intensity of incident electromagnetic infrared radiation having wavelengths with said first and second ranges of wavelengths; and multiplexing means, disposed over the at least one side of the second end and having a plurality of inputs fed by signals provided by said electromagnetic radiation responsive means, for providing at least one serial data stream corresponding to the signals provided by the electromagnetic infrared radiation responsive means.

11. An infrared sensor comprising:

a support member having a first end, with a cavity disposed in said first end substantially extending through the length of the member, said member further having a second end with a platform and a pair of sides, said sides being non-coplanar with said platform;

first means, disposed over the platform of the second end and responsive to electromagnetic infrared radiation having wavelengths within a first range of wavelengths, for providing a first plurality of signals corresponding to intensity of incident electromagnetic infrared radiation having wavelengths within said first range of wavelengths;

second means, disposed over the platform of the second end and responsive to electromagnetic infrared radiation having wavelengths within a second range of wavelengths, for providing a second plurality of signals-corresponding to intensity of incident electromagnetic infrared radiation having wavelengths within said second range of wavelengths;

first multiplexing means, disposed over the platform of the second end and having a plurality of inputs fed by a first portion of the first plurality of signals provided by the first means for providing a serial data stream corresponding to the first portion of the first plurality of signals provided by the first means;

second multiplexing means, disposed over the platform of the second end and having a plurality of inputs fed by a first portion of the second plurality of signals provided by the second means for providing a serial data stream corresponding to the first portion of the second plurality of signals provided by the second means;

third multiplexing means, disposed over a first one of said pair of sides of the second end and having a plurality of inputs fed by a second, remaining portion of the first plurality of signals provided by the first means for providing a serial data stream corresponding to the second, remaining portion of the first plurality of signals provided by the first means; and fourth multiplexing means, disposed over the second one of said pair of sides and having a plurality of inputs fed by the second, remaining portion of the plurality of signals provided by the second means for providing a serial data stream corresponding to the second, remaining portion of the second plurality of signals provided.

12. The infrared sensor recited in claim 11 wherein the support member has conductors disposed thereon extending substantially from said first end to said second end.

13. The infrared sensor recited in claim 12 wherein the conductors are comprised of gold.

14. The infrared sensor recited in claim 11 further comprising a plurality of interconnecting members disposed over the platform of said second end with a first interconnecting member electrically coupled to the first portion of the first plurality of signals provided by the first means and the plurality of inputs of the first multiplexing means, and a second interconnecting member electrically coupled to the first portion of the second plurality of signals provided by the second means and the plurality of inputs of the first multiplexing means.

15. The structure recited in claim 14 wherein each of the plurality of interconnecting members includes a plurality of conductors disposed on a single plane.

16. The structure recited in claim 14 wherein each of the plurality of interconnecting members includes a first plurality of conductors disposed on a first plane and a second plurality of conductors disposed on a second, parallel plane.

17. The infrared sensor recited in claim 11 further comprising a plurality of interconnecting members disposed over said pair of sides of said second end, with a first interconnecting member electrically coupled to the second, remaining portion of the first plurality of signals provided by the first means and the plurality of inputs of the third multiplexing means, and a second interconnecting member electrically coupled to the second, remaining portion of the second plurality of signals provided by the second means and the plurality of inputs of the fourth multiplexing means.

18. The structure recited in claim 17 wherein each of the plurality of interconnecting members includes a plurality of conductors disposed on a single plane.

19. The structure recited in claim 17 wherein each of the plurality of interconnecting members includes a first plurality of conductors disposed on a first plane and a second plurality of conductors disposed on a second, parallel plane.

20. The infrared sensor recited in claim 11 wherein said first and second means are comprised of a plurality of photosensitive elements.

21. The infrared sensor recited in claim 20 wherein the plurality of photosensitive elements are photodiodes.

22. The infrared sensor recited in claim 21 wherein the plurality of photodiodes comprising the first means are comprised of indium antimonide and the plurality of photodiodes comprising the second means are comprised of mercury cadmium telluride.

23. The infrared sensor of claim 11 wherein the support member is glass.

24. The package recited in claim 1 wherein said support member is comprised of glass.

25. An infrared sensor package comprising:
a support member for supporting said infrared sensor having a first end, with a cavity disposed in said first end substantially extending through the length of the member, said member further having a second end; and
a platform disposed over said second end, said platform comprising:
(a) a top surface disposed substantially perpendicular to the length of the support member; and
(b) a pair of curved sidewall portions extending above said top surface.

26. The infrared sensor package recited in claim 25 wherein each one of said pair of curved sidewall portions has a ledge portion disposed above said top surface.

27. The package recited in claim 2 wherein said conductors are integrally formed on said support member.

28. The infrared sensor recited in claim 11 wherein said platform is disposed substantially perpendicular to the length of the support member and said support member further comprises, at said second end, a pair of curved sidewall portions extending above said platform, wherein each one of said pair of curved sidewall portions has a ledge portion disposed above said platform and wherein the infrared sensor further comprises an optical filter supported by said ledge portions.

* * * * *